United States Patent
Lv et al.

(10) Patent No.: US 9,768,202 B2
(45) Date of Patent: Sep. 19, 2017

(54) TFT BACKPLATE STRUCTURE COMPRISING TRANSISTORS HAVING GATE ISOLATION LAYERS OF DIFFERENT THICKNESSES AND MANUFACTURE METHOD THEREOF

(71) Applicant: Shenzhen China Star Optoelectronics Technology Co., Ltd., Shenzhen, Guangdong (CN)

(72) Inventors: Xiaowen Lv, Guangdong (CN); Chihyuan Tseng, Guangdong (CN); Chihyu Su, Guangdong (CN); Hejing Zhang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 34 days.

(21) Appl. No.: 14/426,155

(22) PCT Filed: Sep. 19, 2014

(86) PCT No.: PCT/CN2014/086881
§ 371 (c)(1),
(2) Date: Mar. 4, 2015

(87) PCT Pub. No.: WO2016/033837
PCT Pub. Date: Mar. 10, 2016

(65) Prior Publication Data
US 2016/0247836 A1   Aug. 25, 2016

(30) Foreign Application Priority Data

Sep. 2, 2014 (CN) .......................... 2014 1 0445155

(51) Int. Cl.
*H01L 27/12* (2006.01)
*H01L 29/78* (2006.01)
(Continued)

(52) U.S. Cl.
CPC .......... *H01L 27/1251* (2013.01); *H01L 27/12* (2013.01); *H01L 27/1225* (2013.01);
(Continued)

(58) Field of Classification Search
CPC ............. H01L 27/1251; H01L 27/1237; H01L 29/7869; H01L 27/1288; H01L 21/16; H01L 21/00; H01L 29/24; H01L 21/479
(Continued)

(56) References Cited

U.S. PATENT DOCUMENTS

2007/0099322 A1* 5/2007 Peng .................... H01L 27/1255
438/29
2009/0184315 A1* 7/2009 Lee ..................... H01L 27/1296
257/43
(Continued)

*Primary Examiner* — Allen Parker
*Assistant Examiner* — Didarul Mazumder
(74) *Attorney, Agent, or Firm* — Andrew C. Cheng

(57) ABSTRACT

The present invention provides a TFT backplate structure and a manufacture method thereof. The TFT backplate structure comprises a switch TFT (T1) and a drive TFT (T2). The switch TFT (T1) is constructed by a first source/a first drain (61), a first gate (21), and a first etching stopper layer (51), a first oxide semiconductor layer (41), a first gate isolation layer (31) sandwiched in between. The drive TFT (T2) is constructed by a second source/a second drain (62), a second gate (22), and a second oxide semiconductor layer (42), a first etching stopper layer (51), a second gate isolation layer (32) sandwiched in between. The electrical properties of the switch TFT (T1) and the drive TFT (T2) are different. The switch TFT has smaller subthreshold swing to achieve fast charge and discharge, and the drive TFT has relatively larger subthreshold swing for controlling the current and the grey scale more precisely.

5 Claims, 6 Drawing Sheets

(51) Int. Cl.
*H01L 21/16* (2006.01)
*H01L 21/00* (2006.01)
*H01L 29/24* (2006.01)
*H01L 21/47* (2006.01)
*H01L 29/786* (2006.01)
*H01L 21/77* (2017.01)

(52) U.S. Cl.
CPC ...... *H01L 27/1237* (2013.01); *H01L 27/1288* (2013.01); *H01L 29/7869* (2013.01); *H01L 21/77* (2013.01)

(58) Field of Classification Search
USPC .................. 257/43; 438/85, 86, 104, 754
See application file for complete search history.

(56) References Cited

U.S. PATENT DOCUMENTS

| | | | |
|---|---|---|---|
| 2010/0081246 A1* | 4/2010 | Shin | H01L 21/265 438/303 |
| 2010/0084650 A1* | 4/2010 | Yamazaki | H01L 27/1225 257/43 |
| 2011/0079787 A1* | 4/2011 | Choi | H01L 29/4908 257/71 |
| 2013/0009145 A1* | 1/2013 | Jeon | H01L 27/14692 257/43 |
| 2013/0320329 A1* | 12/2013 | Yeh | H01L 29/7869 257/43 |

* cited by examiner

TFT BACKPLATE STRUCTURE COMPRISING TRANSISTORS HAVING GATE ISOLATION LAYERS OF DIFFERENT THICKNESSES AND MANUFACTURE METHOD THEREOF

FIELD OF THE INVENTION

The present invention relates to a display technology field, and more particularly to a TFT backplate structure and a manufacture method thereof.

BACKGROUND OF THE INVENTION

A flat panel display possesses advantages of being ultra thin, power saved and radiation free and has been widely utilized. Present flat panel displays mainly comprise a LCD (Liquid Crystal Display) or an OLED (Organic Light Emitting Display).

An Organic Light Emitting Diodes Display possesses outstanding properties of self-illumination, no required back light, high contrast, being ultra thin, wide view angle, fast response, being applicable for flexible panel, wide usage temperature range, simple structure and manufacture process and etc., therefore, it is considered to be a new applicable technology for the next generation flat panel display.

Thin Film transistors (TFT) are important components of a flat panel display which can be formed on a glass substrate or a plastic substrate. Generally, the thin film transistors are employed as switch elements and driving elements utilized in such as LCDs, OLEDs, Electrophoresis Displays (EPD).

The oxide semiconductor TFT technology is the most popular skill at present. Because oxide semiconductor has higher electron mobility and simpler manufacture process in comparison with the Low Temperature Poly-silicon (LTPS) and has higher compatibility with the amorphous silicon process. Therefore, the oxide semiconductor has been widely utilized in the skill field of large scale Organic Light Emitting Display and has the great opportunity of application development.

In the present oxide semiconductor TFT backplate structure, the Etching Stopper Layer structure, the Back Channel Etching structure, the Coplanar structure and et cetera are well developed and provide more applications. These structures have respective advantages and drawbacks of their own. For example, the Etching Stopper Layer structure comprises the etching stopper layer to protect the oxide semiconductor layer. The stability is better but the manufacture of the etching stopper layer needs one extra mask and the coupling capacitance is larger which go against the promotion of the yield and the decrease of the manufacture cost; the Back Channel Etching structure and the Coplanar structure can eliminate one mask in the manufacture process to reduce the manufacture cost and the corresponding coupling capacitance can be smaller which provide higher competitiveness and development prospects. However, the stabilities of these two structures have yet to be promoted.

Furthermore, the present oxide semiconductor TFT backplate generally comprises a switch TFT and a drive TFT. In the traditional process, the switch TFT and the drive TFT are formed by the same manufacture process in general. Therefore, the switch TFT and the drive TFT have the same structure and the same electrical properties, such as the same conducting current (Ion), threshold voltage ($V_{th}$), subthreshold swing (S.S) and et cetera. Nevertheless, the demands of the electrical properties for the switch TFT and the drive TFT are different in practical usages. In general, the switch TFT is expected to have a smaller S.S to achieve the object of fast charge and discharge. The drive TFT is expected to have a slightly larger S.S for controlling the current and the grey scale more precisely.

SUMMARY OF THE INVENTION

An objective of the present invention is to provide a TFT backplate structure, capable of differentiating the switch TFT and the drive TFT to make the switch TFT and the drive TFT have different electrical properties and raise the performance of the TFT backplate.

Another objective of the present invention is to provide a manufacture method of a TFT backplate structure, capable of manufacturing the switch TFT and the drive TFT have different electrical properties thereby to raise the performance of the TFT backplate.

For realizing the aforesaid objective, the present invention first provides a TFT backplate structure, comprising a substrate, a first gate and a second gate on the substrate with a distance in between, a first gate isolation layer on the substrate and the first gate, a second gate isolation layer on the substrate and the second gate, a first oxide semiconductor layer right over the first gate and on the first gate isolation layer, a first etching stopper layer on the first oxide semiconductor layer and the second gate isolation layer, a second oxide semiconductor layer right over the second gate and on the first gate isolation layer, a first source/a first drain on the first gate isolation layer and the first etching stopper layer, a second source/a second drain on the first etching stopper layer and the second oxide semiconductor layer, a protective layer on the first source/the first drain and the second source/the second drain, a pixel electrode on the protective layer; the first source/the first drain are connected to the first oxide semiconductor layer and the second gate, and the second source/the second drain are connected to the second oxide semiconductor layer, the pixel electrode is connected to the second source/the second drain; the first source/the first drain, the first gate, and the first etching stopper layer, the first oxide semiconductor layer, the first gate isolation layer sandwiched in between construct a switch TFT; the second source/the second drain, the second gate, and the second oxide semiconductor layer, the first etching stopper layer, the second gate isolation layer sandwiched in between construct a drive TFT, and electrical properties of the switch TFT and the drive TFT are different.

The TFT backplate structure further comprises a second etching stopper layer, and the second source/the second drain, the second gate, and the second etching stopper layer, the second oxide semiconductor layer, the first etching stopper layer, the second gate isolation layer sandwiched in between construct a drive TFT.

Both the first, the second oxide semiconductor layers are IGZO semiconductor layers.

The pixel electrode is an ITO pixel electrode.

The present invention further provides a manufacture method of a TFT backplate structure, comprising steps of:

Step 1, providing a substrate, and deposing a first metal film on the substrate, and patterning the first metal film to form a first gate and a second gate with a distance in between;

Step 2, deposing a gate isolation film on the substrate, the first gate and the second gate and patterning the gate isolation film to form a first gate isolation layer and a second gate isolation layer;

Step 3, deposing an oxide semiconductor film on the substrate of accomplishing the step 2 and patterning the oxide semiconductor film to form a first oxide semiconductor layer right over the first gate and on the first gate isolation layer;

Step 4, deposing an etching stopper film on the substrate of accomplishing the step 3 and patterning the etching stopper film to form a first etching stopper layer on the first oxide semiconductor layer and the second gate isolation layer;

Step 5, deposing an oxide semiconductor film on the substrate of accomplishing the step 4 and patterning the oxide semiconductor film to form a second oxide semiconductor layer right over the second gate and on the first etching stopper layer;

Step 6, deposing a second metal film on the substrate of accomplishing the step 5 and patterning the second metal film to form a first source/a first drain, and a second source/a second drain;

the first source/the first drain are connected to the first oxide semiconductor layer and the second gate, and the second source/the second drain are connected to the second oxide semiconductor layer;

Step 7, forming a protective layer on the first source/the first drain, and the second source/the second drain;

Step 8, forming a pixel electrode on the protective layer;

The pixel electrode is connected to the second source/the second drain.

The fifth step further comprises deposing and patterning an etching stopper film on the second oxide semiconductor layer to form a second etching stopper layer on the second oxide semiconductor layer.

Both the first, the second oxide semiconductor layers are IGZO semiconductor layers.

The pixel electrode is an ITO pixel electrode.

The benefits of the present invention are: according to the TFT backplate structure of the present invention, by arranging the first gate isolation layer as an isolation layer between the source/the drain of the switch TFT and the gate, and arranging the first etching stopper layer and the second gate isolation layer as an isolation layer between the source/the drain of the drive TFT and the gate to make that the switch TFT and the drive TFT have different electrical properties. Accordingly, the switch TFT possesses a smaller subthreshold swing for fast charge and discharge, and the drive TFT possesses a larger subthreshold swing for controlling the current and the grey scale more precisely to raise the performance of the TFT backplate. According to the manufacture method of the TFT backplate structure, by forming the first etching stopper layer on the second gate isolation layer, the switch TFT and the drive TFT have different electrical properties to raise the performance of the TFT backplate.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution, as well as beneficial advantages, of the present invention will be apparent from the following detailed description of an embodiment of the present invention, with reference to the attached drawings.

In drawings.

DETAILED DESCRIPTION OF PREFERRED EMBODIMENTS

In order to better understand the characteristics and technical aspect of the invention, please refer to the following detailed description of the present invention is concerned with the diagrams.

Figure 1:
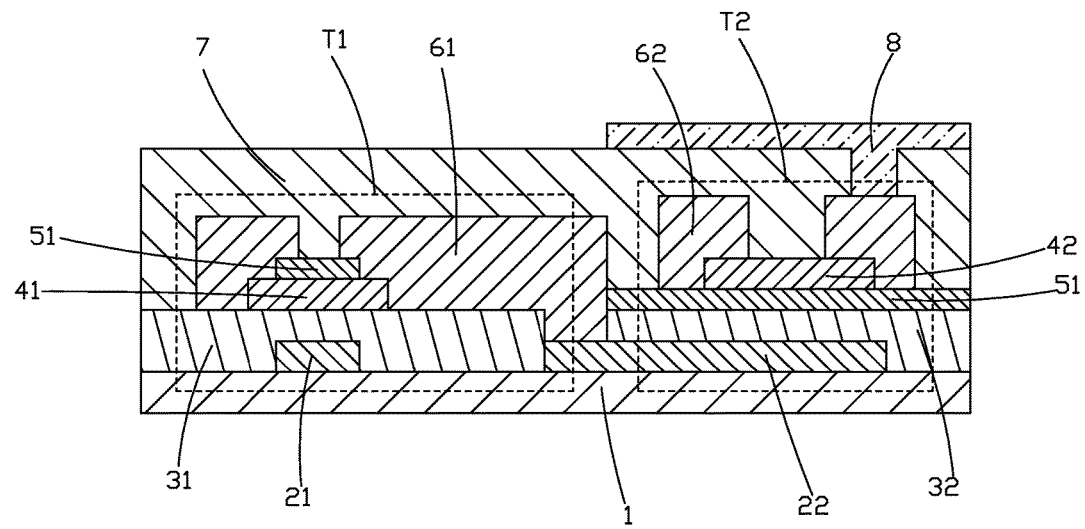
FIG. 1 is a sectional diagram of a TFT backplate structure according to the first embodiment of the present invention.

Please refer to FIG. 1, which is the first embodiment of the TFT backplate structure according to the present invention. The TFT backplate structure comprises comprising a substrate 1, a first gate 21 and a second gate 22 on the substrate 1 with a distance in between, a first gate isolation layer 31 on the substrate 1 and the first gate 21, a second gate isolation layer 32 on the substrate 1 and the second gate 22, a first oxide semiconductor layer 41 right over the first gate 21 and on the first gate isolation layer 31, a first etching stopper layer 51 on the first oxide semiconductor layer 41 and the second gate isolation layer 32, a second oxide semiconductor layer 42 right over the second gate 22 and on the second gate isolation layer 32, a first source/a first drain 61 on the first gate isolation layer 31 and the first etching stopper layer 51, a second source/a second drain 62 on the first etching stopper layer 51 and the second oxide semiconductor layer 42, a protective layer 7 on the first source/the first drain 61 and the second source/the second drain 62, a pixel electrode 8 on the protective layer 7.

Both the first gate 21 and the second gate 22 are formed by patterning the same first metal film. The first gate isolation layer 31 and the second gate isolation layer 32 are formed by patterning the same gate isolation film. The first oxide semiconductor layer 41 is formed by patterning an oxide semiconductor film. The second oxide semiconductor layer 42 is formed by patterning another oxide semiconductor film. The first etching stopper layer 51 is formed by patterning an etching stopper film. Both the first source/the first drain 61 and the second source/the second drain 62 are formed by patterning the same second metal film.

The first source/the first drain 61 are connected to the first oxide semiconductor layer 41 and the second gate 22; the second source/the second drain 62 are connected to the second oxide semiconductor layer 42; the pixel electrode 8 is connected to the second source/the second drain 62.

The first source/the first drain 61, the first gate 21, and the first etching stopper layer 51, the first oxide semiconductor layer 41, the first gate isolation layer 31 sandwiched in between construct a switch TFT T1; the second source/the second drain 62, the second gate 22, and the second oxide semiconductor layer 42, the first etching stopper layer 51, the second gate isolation layer 32 sandwiched in between construct a drive TFT T2.

The first gate isolation layer 31 is employed as an isolation layer of the first source/the first drain 61 and the first gate 21 of the switch TFT T1. The first etching stopper layer 51 and the second gate isolation layer 32 are employed as an isolation layer of the second source/the second drain 62 and the second gate 22. Structural differentiations exist between the switch TFT T1 and the drive TFT T2 thereby to make the electrical properties of the switch TFT T1 and the drive TFT T2 different: the switch TFT T1 possesses a smaller sub-threshold swing S.S for fast charge and discharge; the drive TFT T2 possesses a relatively larger subthreshold swing S.S for controlling the current and the grey scale more precisely. Therefore, the TFT backplate structure can meet the demands of the practical usage to raise the performance of the TFT backplate in advance.

Furthermore, both the first, the second oxide semiconductor layers 41, 42 are Indium Gallium Zinc Oxide (IGZO) semiconductor layers; the pixel electrode 8 is an Indium Tin Oxide (ITO) pixel electrode.

Figure 2:
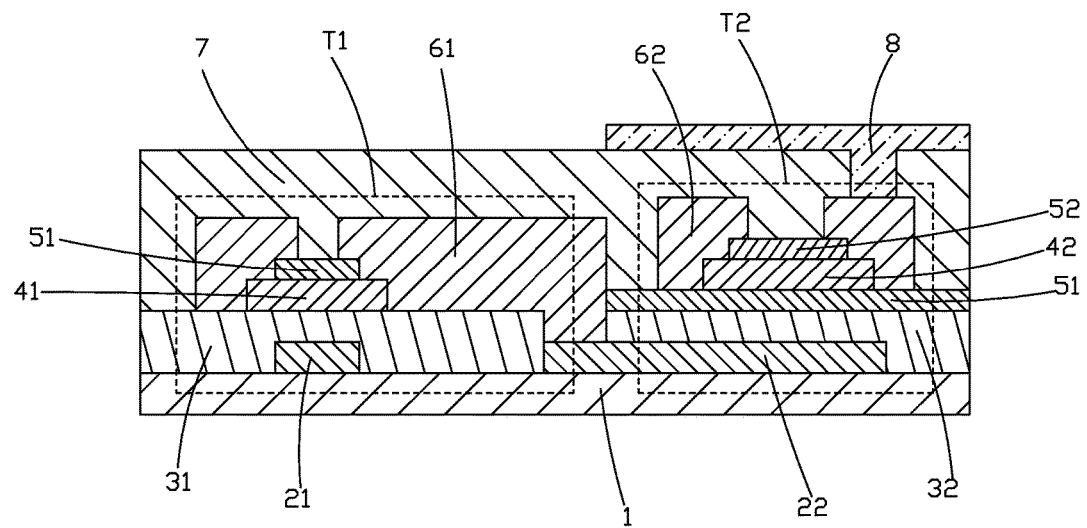
FIG. 2 is a sectional diagram of a TFT backplate structure according to the second embodiment of the present invention.

Please refer to FIG. 2, which is the second embodiment of the TFT backplate structure according to the present invention. The difference of the second embodiment from the first embodiment is that the TFT backplate structure further comprises a second etching stopper layer 52 on the second oxide semiconductor layer 42. The second etching stopper layer 52 is formed by patterning another etching stopper film. Correspondingly, the drive TFT T2 is constructed by the second source/a second drain 62, the second gate 22, and the second etching stopper layer 52, the second oxide semiconductor layer 42, the first etching stopper layer 51, a second gate isolation layer 32 sandwiched in between. Other figures are the same as the first embodiment. The repeated description is omitted here.

In comparison with the second embodiment, the first embodiment omits the second etching stopper layer 52 which can eliminate one mask process and raise the process efficiency.

Figure 3:
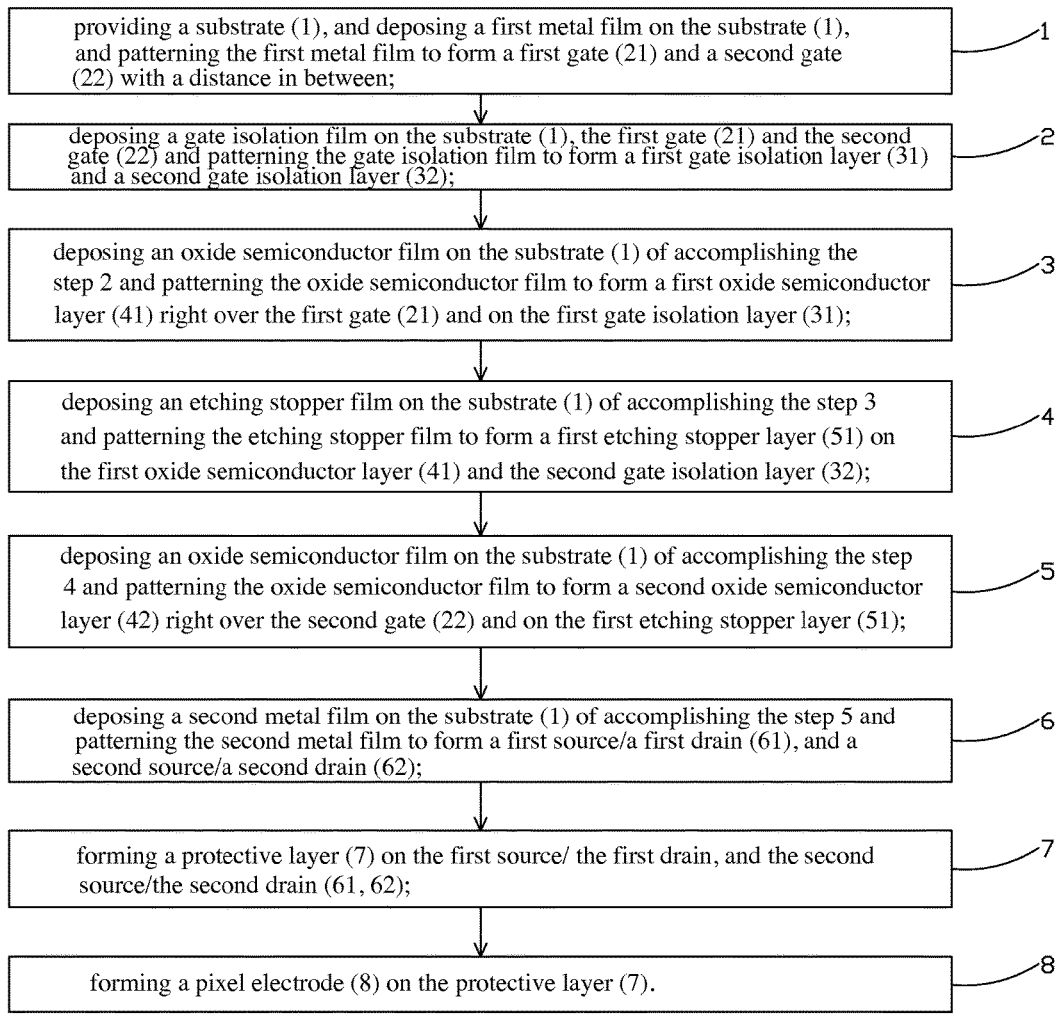
FIG. 3 is a flowchart of a manufacture method of a TFT backplate structure according to the present invention.
Figure 4:
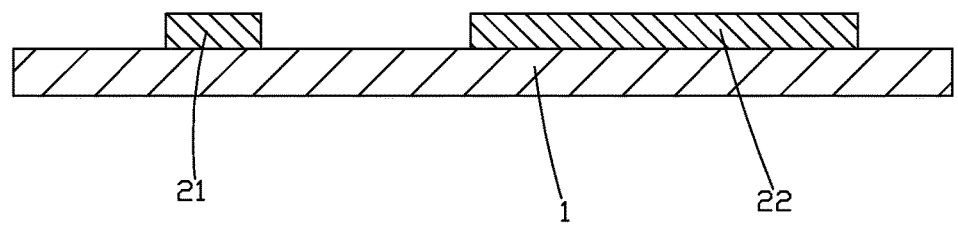
FIG. 4 is a diagram of step 1 of the manufacture method of the TFT backplate structure according to the present invention.

Please refer to FIG. 3. The present invention further provides a manufacture method of a TFT backplate structure, comprising steps of:

Step 1, as shown in FIG. 4, providing a substrate 1, and deposing a first metal film on the substrate 1, and patterning the first metal film to form a first gate 21 and a second gate 22 with a distance in between.

Figure 5:
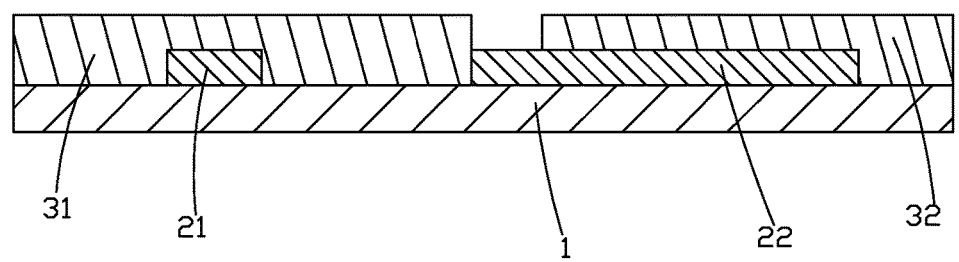
FIG. 5 is a diagram of step 2 in the manufacture method of the TFT backplate structure according to the present invention.

Step 2, as shown in FIG. 5, deposing a gate isolation film on the substrate 1, the first gate 21 and the second gate 22 and patterning the gate isolation film to form a first gate isolation layer 31 and a second gate isolation layer 32.

The first gate isolation layer 31 and the second gate isolation layer 32 formed in the step 2 have the same material and the same thickness.

Figure 6:
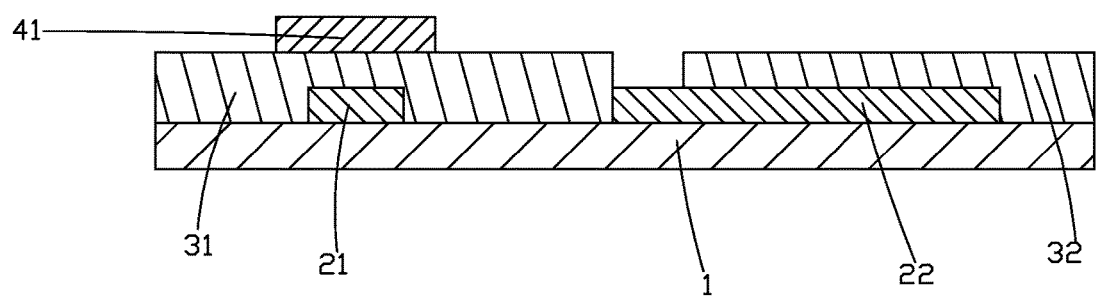
FIG. 6 is a diagram of step 3 of the manufacture method of the TFT backplate structure according to the present invention.

Step 3, as shown in FIG. 6, deposing an oxide semiconductor film on the substrate 1 of accomplishing the step 2 and patterning the oxide semiconductor film to form a first oxide semiconductor layer 41 right over the first gate 21 and on the first gate isolation layer 31.

Specifically, the first oxide semiconductor layer 41 is an IGZO semiconductor layer.

Figure 7:
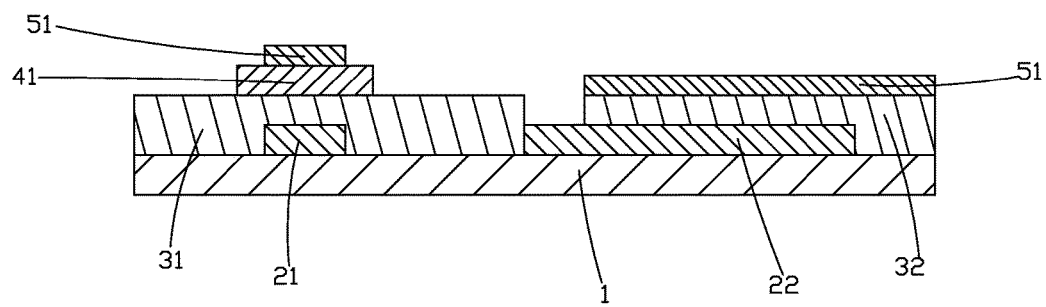
FIG. 7 is a diagram of step 4 of the manufacture method of the TFT backplate structure according to the present invention.

Step 4, as shown in FIG. 7, deposing an etching stopper film on the substrate 1 of accomplishing the step 3 and patterning the etching stopper film to form a first etching stopper layer 51 on the first oxide semiconductor layer 41 and the second gate isolation layer 32.

The step 4 is different from the traditional process. The first etching stopper layer 51 is not only formed on the first oxide semiconductor layer 41 but also formed on the second gate isolation layer 32 to make the first etching stopper layer 51 completely cover the second gate isolation layer 32.

Figure 8:
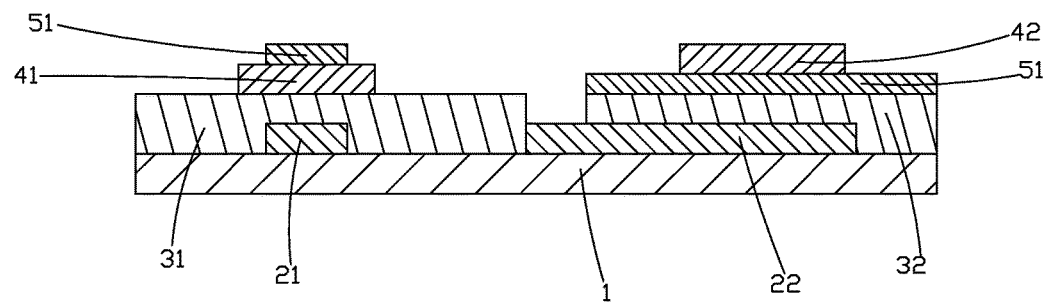
FIG. 8 is a diagram showing one embodiment of step 5 of the manufacture method of the TFT backplate structure according to the present invention.

Step 5, FIG. 8 shows one embodiment of the step 5, deposing an oxide semiconductor film on the substrate 1 of accomplishing the step 4 and patterning the oxide semiconductor film to form a second oxide semiconductor layer 42 right over the second gate 22 and on the first etching stopper layer 51.

Specifically, the second oxide semiconductor layer 42 is an IGZO semiconductor layer.

Figure 9:
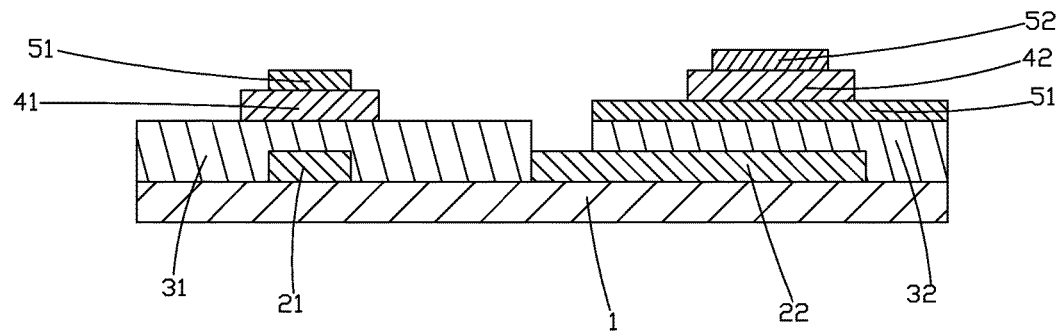
FIG. 9 is a diagram showing another embodiment of step 5 of the manufacture method of the TFT backplate structure according to the present invention.

FIG. 9 shows another embodiment of the step 5. Beside forming the second oxide semiconductor layer 42, the step further comprises deposing and patterning an etching stopper film on the second oxide semiconductor layer 42 to form a second etching stopper layer 52 on the second oxide semiconductor layer 42.

In comparison with the embodiment shown in FIG. 9, the embodiment shown in FIG. 8m can eliminate and save one mask process and raise the process efficiency.

Figure 10:
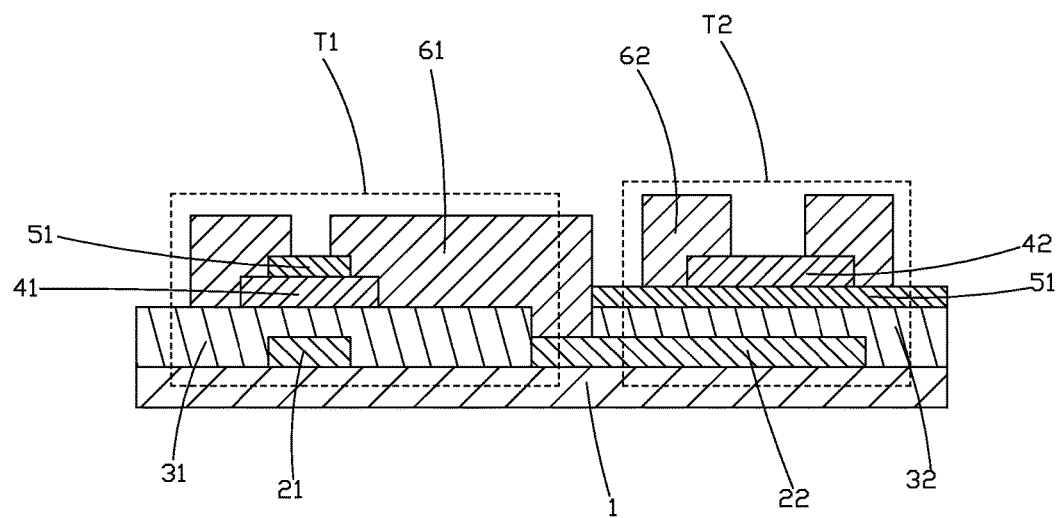
FIG. 10 is a diagram of step 6 of the manufacture method of the TFT backplate structure according to the present invention.

Step 6, as shown in FIG. 10, deposing a second metal film on the substrate 1 of accomplishing the step 5 and patterning the second metal film to form a first source/a first drain 61, and a second source/a second drain 62.

The first source/the first drain 61 are connected to the first oxide semiconductor layer 41 and the second gate 22, and the second source/the second drain 62 are connected to the second oxide semiconductor layer 42.

After the step 6 is accomplished, the first source/the first drain 61, the first gate 21, and the first etching stopper layer 51, the first oxide semiconductor layer 41, the first gate isolation layer 31 sandwiched in between construct the switch TFT T1; the second source/the second drain 62, the second gate 22, and the second oxide semiconductor layer 42, the first etching stopper layer 51, the second gate isolation layer 32 sandwiched in between construct the drive TFT T2. Alternatively, the second source/the second drain 62, the second gate 22, and the second etching stopper layer 52, the second oxide semiconductor layer 42, the first etching stopper layer 51, the second gate isolation layer 32 sandwiched in between construct the drive TFT T2.

Figure 11:
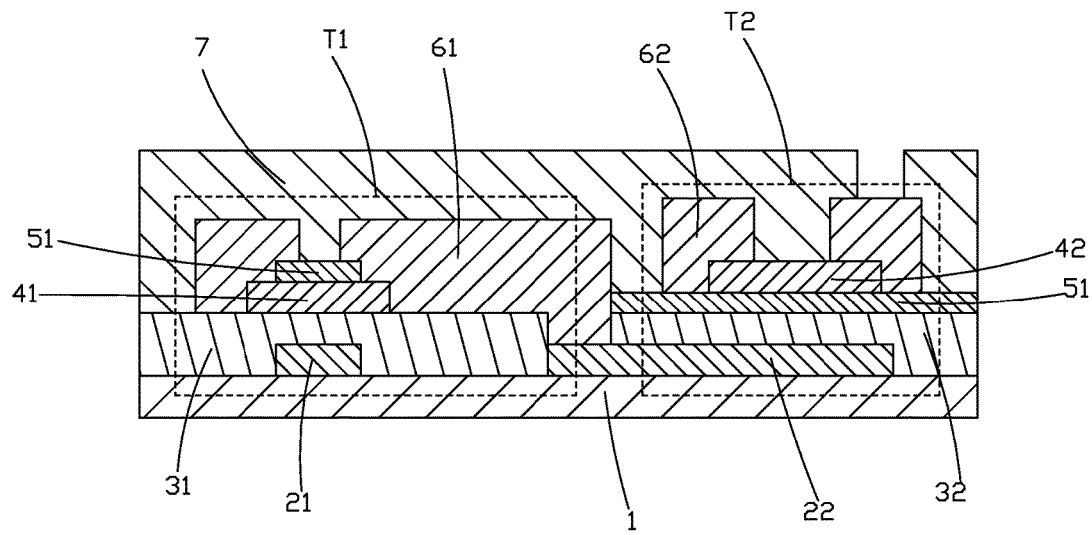
FIG. 11 is a diagram of step 7 of the manufacture method of the TFT backplate structure according to the present invention.

Step 7, as shown in FIG. 11, forming a protective layer 7 on the first source/the first drain, and the second source/the second drain 61, 62.

Figure 12:
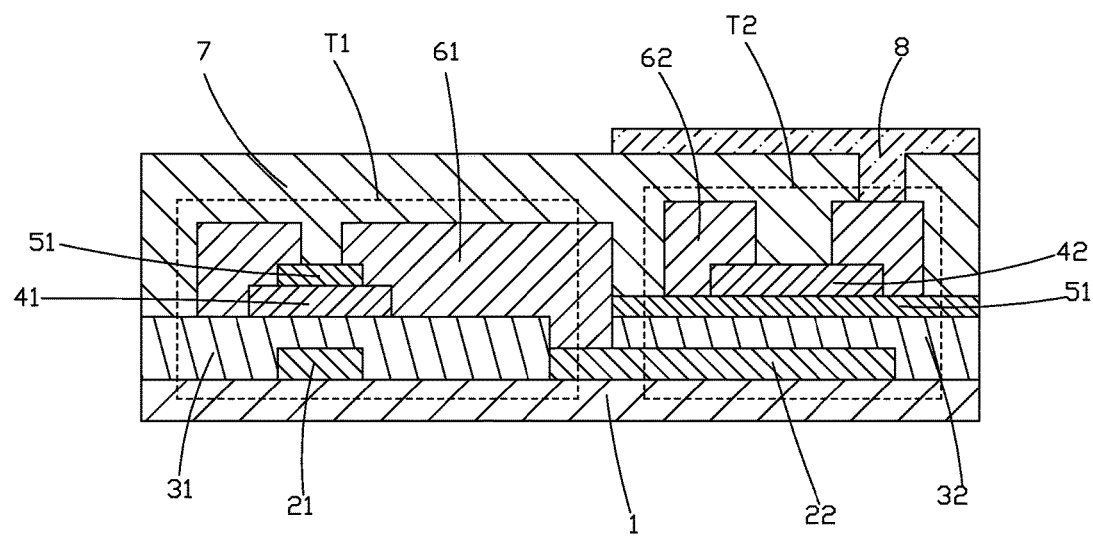
FIG. 12 is a diagram of step 8 of the manufacture method of the TFT backplate structure according to the present invention.

Step 8, as shown in FIG. 12, forming a pixel electrode 8 on the protective layer 7.

The pixel electrode 8 is connected to the second source/the second drain 62.

Specifically, the pixel electrode 8 is an ITO pixel electrode.

Structural differentiations exist between the switch TFT T1 and the drive TFT T2 because the first etching stopper layer 51 is manufactured on the second gate isolation layer 32 according to the method: only the first gate isolation layer 31 exists between the first source/the first drain 61 and the first gate 21 of the switch TFT T1, and not only the second gate isolation layer 32 but also the first etching stopper layer 51 exist between the second source/the second drain 62 and the second gate 22. Accordingly, the switch TFT T1 and the drive TFT T2 have different electrical properties: the switch TFT possesses a smaller subthreshold swing S.S for fast charge and discharge; the drive TFT possesses a relatively larger subthreshold swing S.S for controlling the current and the grey scale more precisely.

In conclusion, according to the TFT backplate structure of the present invention, by arranging the first gate isolation layer as an isolation layer between the source/the drain of the switch TFT and the gate, and arranging the first etching stopper layer and the second gate isolation layer as an isolation layer between the source/the drain of the drive TFT and the gate to make that the switch TFT and the drive TFT have different electrical properties. Accordingly, the switch TFT possesses a smaller subthreshold swing for fast charge and discharge, and the drive TFT possesses a larger subthreshold swing for controlling the current and the grey scale more precisely to raise the performance of the TFT backplate. According to the manufacture method of the TFT backplate structure, by forming the first etching stopper layer on the second gate isolation layer, the switch TFT and the drive TFT have different electrical properties to raise the performance of the TFT backplate.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of a TFT backplate structure, comprising steps of:
    step 1, providing a substrate, and depositing a first metal film on the substrate, and patterning the first metal film to form a first gate and a second gate with a distance in between such that the first gate and the second gate are spaced from each other in a sideway direction;
    step 2, depositing a gate isolation film on the substrate, the first gate and the second gate and patterning the gate isolation film to form a first gate isolation layer and a second gate isolation layer;
    step 3, depositing an oxide semiconductor film on the substrate of accomplishing the second step and patterning the oxide semiconductor film to form a first oxide semiconductor layer right over the first gate and on the first gate isolation layer;
    step 4, depositing an etching stopper film on the substrate of accomplishing the third step and patterning the etching stopper film to form a first etching stopper layer on the first oxide semiconductor layer and the second gate isolation layer;
    step 5, depositing an oxide semiconductor film on the substrate of accomplishing the fourth step and patterning the oxide semiconductor film to form a second oxide semiconductor layer right over the second gate and on the first etching stopper layer;
    step 6, depositing a second metal film on the substrate of accomplishing the fifth step and patterning the second metal film to form a first source/a first drain, and a second source/a second drain;
    wherein the first source/the first drain are connected to the first oxide semiconductor layer and the second gate, and the second source/the second drain are connected to the second oxide semiconductor layer;
    step 7, forming a protective layer on the first source/the first drain, and the second source/the second drain; and
    step 8, forming a pixel electrode on the protective layer;
    wherein the pixel electrode is connected to the second source/the second drain;
    wherein the second oxide semiconductor layer is located on the first etching stopper layer that is directly formed and stacked on the second gate isolation layer in a predetermined direction and the second oxide semiconductor layer is spaced from the first oxide semiconductor layer in the sideway direction that is different from the predetermined direction; and
    wherein the first source/the first drain, the first gate, and the first etching stopper layer, the first oxide semiconductor layer, and the first gate insulation layer that are between the first source/the first drain and the first gate collectively form a first transistor and the second source/the second drain, second first gate, and the second oxide semiconductor layer, the first etching stopper layer, and the second gate insulation layer that are between the second source/the second drain and the second gate collectively form a second transistor, the first and second transistors being arranged side by side and spaced from each other in the sideway direction, wherein in the side-by-side arranged first and second transistors, the first etching stopper layer is located above the first oxide semiconductor layer and below the second oxide semiconductor layer.

2. The manufacture method of the TFT backplate structure according to claim 1, wherein the fifth step further comprises depositing and patterning an etching stopper film on the second oxide semiconductor layer to form a second etching stopper layer on the second oxide semiconductor layer.

3. The manufacture method of the TFT backplate structure according to claim 1, wherein both the first and the second oxide semiconductor layers are IGZO semiconductor layers.

4. The manufacture method of the TFT backplate structure according to claim 1, wherein the pixel electrode is an ITO pixel electrode.

5. A manufacture method of a TFT backplate structure, comprising steps of:
    step 1, providing a substrate, and depositing a first metal film on the substrate, and patterning the first metal film to form a first gate and a second gate with a distance in between such that the first gate and the second gate are spaced from each other in a sideway direction;
    step 2, depositing a gate isolation film on the substrate, the first gate and the second gate and patterning the gate isolation film to form a first gate isolation layer and a second gate isolation layer;
    step 3, depositing an oxide semiconductor film on the substrate of accomplishing the second step and patterning the oxide semiconductor film to form a first oxide semiconductor layer right over the first gate and on the first gate isolation layer;
    step 4, depositing an etching stopper film on the substrate of accomplishing the third step and patterning the etching stopper film to form a first etching stopper layer on the first oxide semiconductor layer and the second gate isolation layer;

step 5, depositing an oxide semiconductor film on the substrate of accomplishing the fourth step and patterning the oxide semiconductor film to form a second oxide semiconductor layer right over the second gate and on the first etching stopper layer;

step 6, depositing a second metal film on the substrate of accomplishing the fifth step and patterning the second metal film to form a first source/a first drain, and a second source/a second drain;

wherein the first source/the first drain are connected to the first oxide semiconductor layer and the second gate, and the second source/the second drain are connected to the second oxide semiconductor layer;

step 7, forming a protective layer on the first source/the first drain, and the second source/the second drain; and step 8, forming a pixel electrode on the protective layer;

wherein the pixel electrode is connected to the second source/the second drain;

wherein the second oxide semiconductor layer is located on the first etching stopper layer that is directly formed and stacked on the second gate isolation layer in a predetermined direction and the second oxide semiconductor layer is spaced from the first oxide semiconductor layer is in the sideway direction that is different from the predetermined direction;

wherein the first source/the first drain, the first gate, and the first etching stopper layer, the first oxide semiconductor layer, and the first gate insulation layer that are between the first source/the first drain and the first gate collectively form a first transistor and the second source/the second drain, second first gate, and the second oxide semiconductor layer, the first etching stopper layer, and the second gate insulation layer that are between the second source/the second drain and the second gate collectively form a second transistor, the first and second transistors being arranged side by side and spaced from each other in the sideway direction, wherein in the side-by-side arranged first and second transistors, the first etching stopper layer is located above the first oxide semiconductor layer and below the second oxide semiconductor layer;

wherein the fifth step further comprises depositing and patterning an etching stopper film on the second oxide semiconductor layer to form a second etching stopper layer on the second oxide semiconductor layer;

wherein both the first and the second oxide semiconductor layers are IGZO semiconductor layers; and wherein the pixel electrode is an ITO pixel electrode.

* * * * *